United States Patent
Akaike et al.

(10) Patent No.: US 8,344,816 B2
(45) Date of Patent: Jan. 1, 2013

(54) FUNDAMENTAL WAVE/OVERTONE CRYSTAL OSCILLATOR

(75) Inventors: Kazuo Akaike, Sayama (JP); Hiroshi Hoshigami, Sayama (JP); Mohd Hafidz Bin Ahmad Adlan, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 31 days.

(21) Appl. No.: 12/929,892

(22) Filed: Feb. 23, 2011

(65) Prior Publication Data

US 2011/0204983 A1 Aug. 25, 2011

(30) Foreign Application Priority Data

Feb. 23, 2010 (JP) ................. P2010-036906

(51) Int. Cl.
*H03B 5/32* (2006.01)
(52) U.S. Cl. .............. 331/158; 331/116 R; 331/116 FE
(58) Field of Classification Search .............. 331/116 R, 331/116 FE, 158
See application file for complete search history.

(56) References Cited

U.S. PATENT DOCUMENTS 7,283,009 B2 * 10/2007 Kobayashi ..................... 331/179

FOREIGN PATENT DOCUMENTS

| JP | S54-087051 | 7/1979 |
| JP | S64-051806 | 2/1989 |
| JP | 02-207603 | 8/1990 |
| JP | 06-006134 | 1/1994 |
| JP | 06-140838 | 5/1994 |
| JP | 11-177342 | 7/1999 |
| JP | 2000-307343 | 11/2000 |
| JP | 2001-168642 | 6/2001 |
| JP | 2003-324318 | 11/2003 |
| JP | 2004-128593 | 4/2004 |
| JP | 2006-148266 | 6/2006 |
| JP | 2007-274633 | 10/2007 |
| JP | 2009-177393 | 8/2009 |

* cited by examiner

*Primary Examiner* — Arnold Kinkead
(74) *Attorney, Agent, or Firm* — Jacobson Holman PLLC (57) ABSTRACT

Provided is a fundamental wave/overtone crystal oscillator to obtain fundamental wave oscillation and overtone oscillation with one crystal unit and to optimize the excitation current depending on the fundamental wave oscillation and the overtone oscillation. The fundamental wave/overtone crystal oscillator includes a crystal unit that oscillates with fundamental waves or with overtones, and an oscillator circuit that amplifies an excitation current from the crystal unit and outputs an oscillatory frequency. A capacitor Cf and a capacitor Co are connected in parallel with the base of a transistor in the oscillator circuit as well as the emitter. A switch is provided so as to connect or disconnect the capacitor Cf with respect to the circuit in response to a switching signal. The switch turns ON when the crystal oscillator oscillates with fundamental waves, and turns OFF when the crystal oscillator oscillates with overtones.

3 Claims, 9 Drawing Sheets

FUNDAMENTAL WAVE/OVERTONE CRYSTAL OSCILLATOR

This application has a priority of Japanese no. 2010-036906 filed Feb. 23, 2010, hereby incorporated by reference.

BACKGROUND OF THE INVENTION

1. Field of the Invention

The present invention relates to a crystal oscillator, and more particularly relates to a fundamental wave/overtone crystal oscillator enabling one crystal oscillator to oscillate in a fundamental wave mode or in an overtone mode.

2. Description of the Related Art

Prior Art

Conventionally, a crystal unit is capable of oscillating in a fundamental wave mode or in an overtone mode with common specifications.

However, a circuit has to be configured in an optimum condition for each of the fundamental wave mode and the overtone mode, and furthermore an excitation current is preferably set optimally for usages and specifications of a crystal unit. Therefore, when a plurality of signals for fundamental waves and for overtones are to be obtained in one device, the device has to be provided with a pair of a crystal unit and a circuit for each mode.

Figure 7:
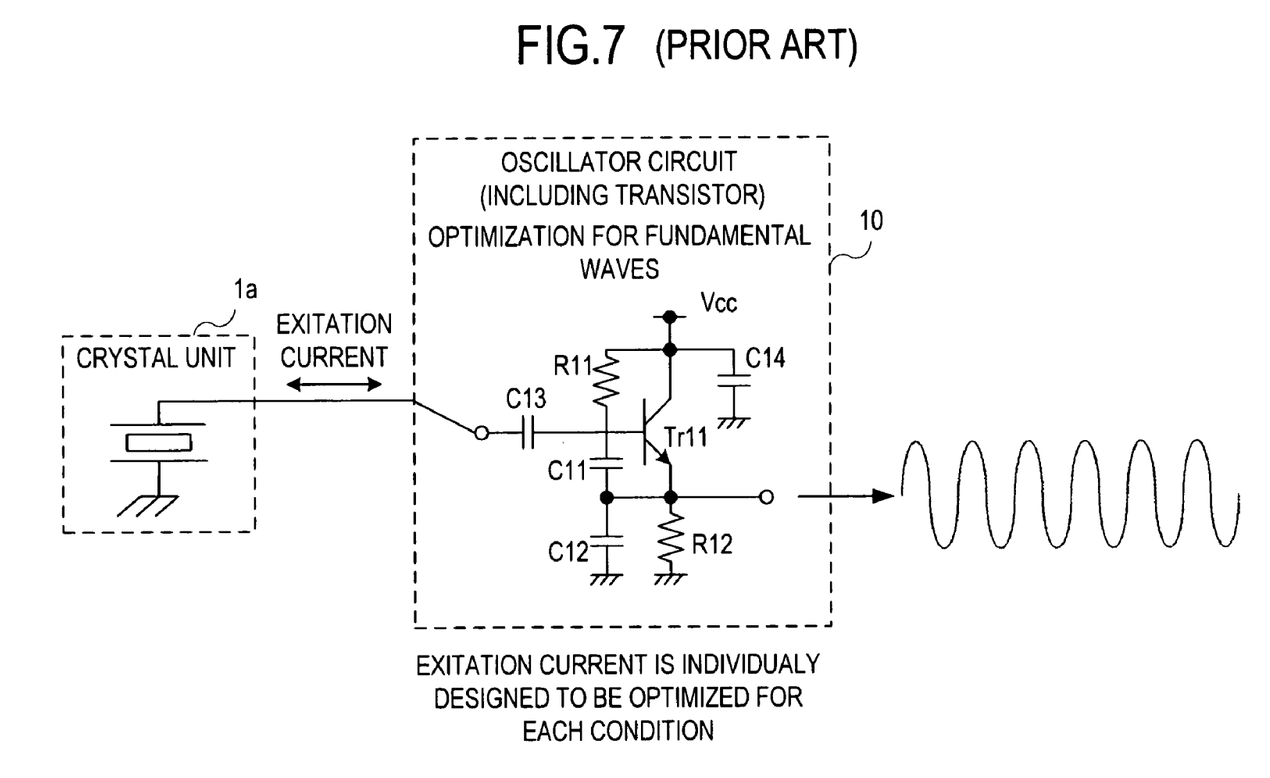
FIG. 7 is a circuit diagram of a conventional fundamental wave crystal oscillator.

[Fundamental Wave Crystal Oscillator: FIG. 7]

Referring to FIG. 7, a conventional fundamental wave crystal oscillator is described below. FIG. 7 is a circuit diagram of a conventional fundamental wave crystal oscillator.

As illustrated in FIG. 7, the conventional fundamental wave crystal oscillator includes a crystal unit 1a oscillating with fundamental waves and an oscillator circuit 10.

The oscillator circuit 10 is made up of elements optimized for fundamental waves.

The oscillator circuit 10 is a Colpitts oscillator circuit, in which an excitation current of a crystal unit 1a is fed to the base of a transistor Tr11 via a capacitor C13, and a power supply voltage Vcc is supplied to the collector of the transistor Tr11 as well as the base via a resistor R11.

The collector of the transistor Tr11 is connected with one end of a capacitor C14, and the other end of the capacitor C14 is grounded.

The base of the transistor Tr11 is further connected with a capacitor C11 and a capacitor C12 connected in series, and the other end of the capacitor C12 is grounded.

The emitter of the transistor Tr11 is grounded via a resistor R12.

A point between the capacitor C11 and the capacitor C12 is connected with the emitter, and the emitter outputs an oscillatory frequency for fundamental waves.

Figure 8:
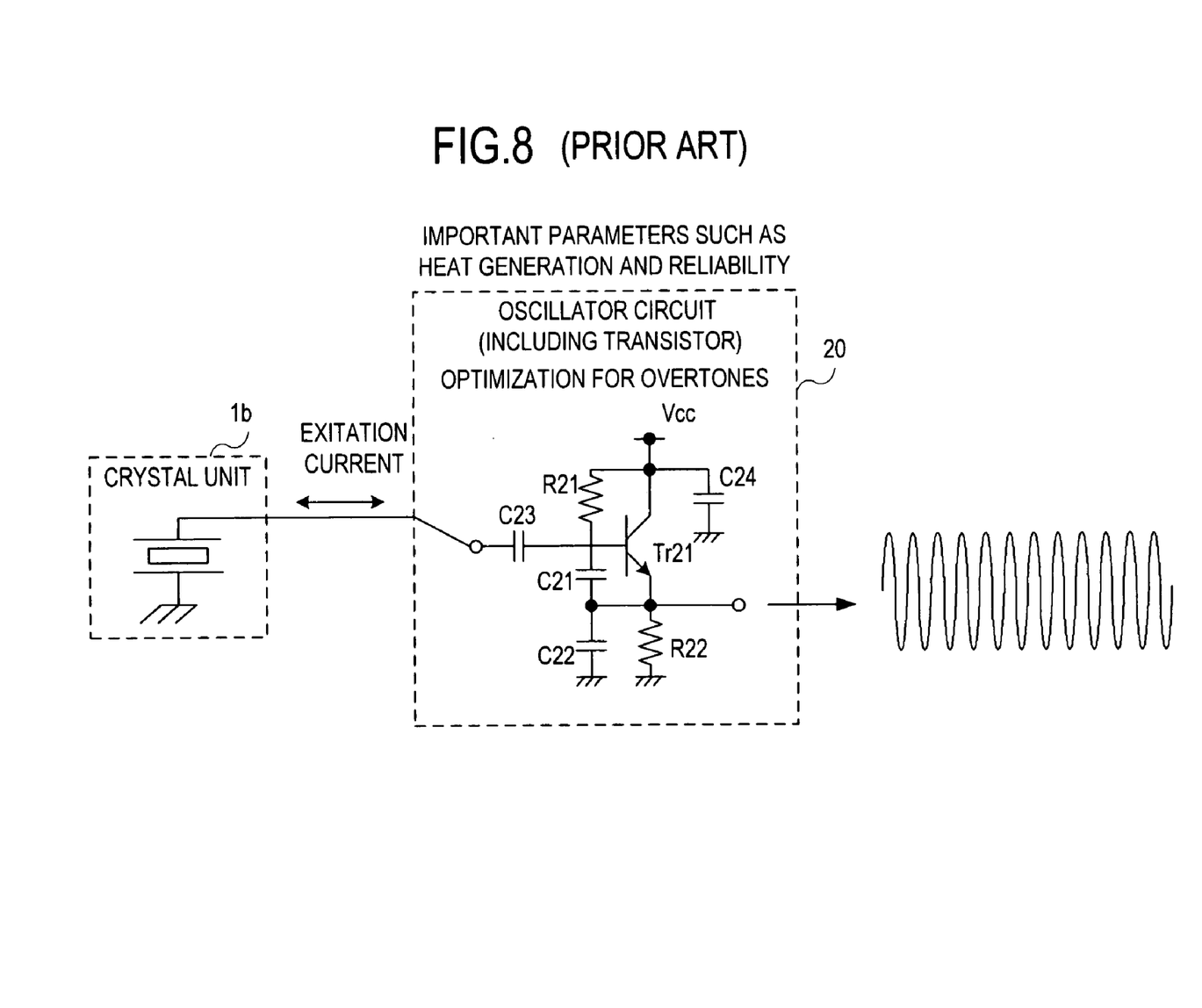
FIG. 8 is a circuit diagram of a conventional overtone crystal oscillator.

[Overtone Crystal Oscillator: FIG. 8]

Referring to FIG. 8, a conventional overtone crystal oscillator is described below. FIG. 8 is a circuit diagram of a conventional overtone crystal oscillator.

As illustrated in FIG. 8, the conventional overtone crystal oscillator includes a crystal unit 1b oscillating with overtones, and an oscillator circuit 20.

The oscillator circuit 20 is made up of elements optimized for overtones.

The oscillator circuit 20 is a Colpitts oscillator circuit, in which an excitation current of a crystal unit 1b is fed to the base of a transistor Tr21 via a capacitor C23, and a power supply voltage Vcc is supplied to the collector of the transistor Tr21 as well as the base via a resistor R21.

The collector of the transistor Tr21 is connected with one end of a capacitor C24, and the other end of the capacitor C24 is grounded.

The base of the transistor Tr21 is further connected with a capacitor C21 and a capacitor C22 connected in series, and the other end of the capacitor C22 is grounded. The emitter of the transistor Tr21 is grounded via a resistor R22.

A point between the capacitor C21 and the capacitor C22 is connected with the emitter, and the emitter outputs an oscillatory frequency for overtones.

Figure 9:
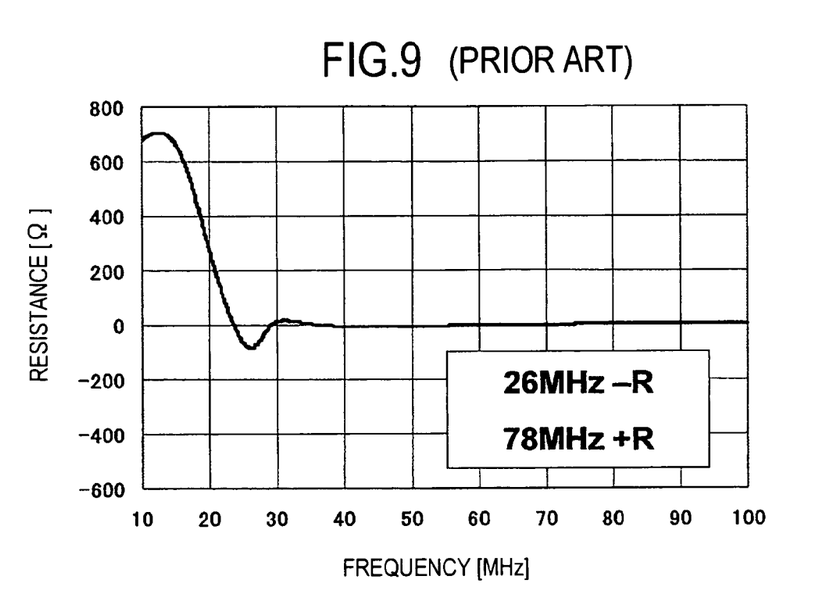
FIG. 9 exemplifies a negative resistance characteristic of an oscillator circuit with fundamental waves.
Figure 10:
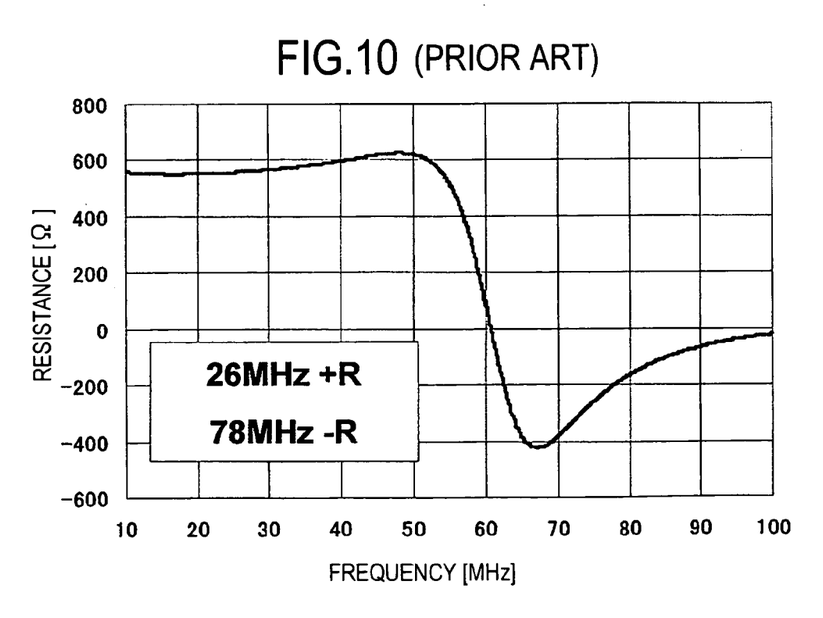
FIG. 10 exemplifies a negative resistance characteristic of an oscillator circuit with overtones.

[Negative Resistance Characteristics: FIG. 9, FIG. 10]

Referring next to FIG. 9 and FIG. 10, negative resistance characteristics in crystal oscillators are described below. FIG. 9 exemplifies a negative resistance characteristic of an oscillator circuit with fundamental waves, and FIG. 10 exemplifies a negative resistance characteristic of an oscillator circuit with overtones.

Oscillation occurs when the circuit side viewed from the crystal unit shows negative resistance at an oscillatory frequency of the crystal unit.

Oscillation occurs with fundamental waves in the circuit having negative resistance in a fundamental wave frequency band. FIG. 9 exemplifies negative resistance in the fundamental-wave frequency band for a crystal unit of 26 MHz.

Oscillation occurs with overtones in the circuit having negative resistance in an overtone band. FIG. 10 exemplifies negative resistance in an overtone frequency band for a crystal unit of 26 MHz.

Related Art

Related art includes: Japanese Patent Application Laid-Open No. S64-051806 "IC for crystal oscillator" (Applicant: Nihon Dempa Kogyo Co., Ltd./Patent Document 1), Japanese Patent Application Laid-Open No. 2004-128593 "Oscillation circuit" (Applicant: Kinseki Ltd/Patent Document 2), and Japanese Patent Application Laid-Open No. 2009-177393 "Third overtone oscillator circuit" (Applicant: NEC Corp/Patent Document 3).

Patent Document 1 discloses an IC for crystal oscillator, in which a first resistor and a second resister having resistance lower than that of the first resistor are disposed between an input terminal and an output terminal, and in the case of fundamental wave oscillation, the first resistor is selected, and in the case of the third overtones, the second resistor is selected by a switch 7, thus flexibly performing switching between fundamental waves and the third overtone oscillation.

Patent Document 2 discloses an oscillation circuit including two feedback resistors connected in parallel with an inverter and a piezoelectric resonator connected between the input and the output terminals of the inverter, in which any one of the feedback resistors is selected by a switching element, thus performing switching between fundamental wave oscillation and overtone oscillation.

Patent Document 3 discloses a third overtone oscillator circuit in which a crystal unit is connected in parallel with an inverter, and a plurality of capacitors and switches for selection are provided for each of the input terminal and the output terminal. Even when the negative resistance characteristic of the oscillator circuit changes with a stray capacitance of a board, the capacitance of the capacitors are adjusted by switching the switches, thus adjusting the negative resistance.

SUMMARY OF THE INVENTION

The conventional oscillators, however, have to optimize the elements in the oscillator circuit for an oscillator oscillating with fundamental waves and have to optimize the elements in the oscillator circuit for an oscillator oscillating with overtones, and therefore they have difficulty in easily making one crystal unit oscillate with fundamental waves or with overtones.

Patent Documents 1 and 2 describe the techniques of switching resistors for oscillation with fundamental waves or overtones. However, it is difficult to optimize the excitation current simply by switching resistors.

Patent Document 3 is to stabilize overtone oscillation, which is not for obtaining fundamental wave or overtone oscillation.

In view of the above-stated circumstances, it is an object of the present invention to provide a fundamental wave/overtone crystal oscillator capable of obtaining fundamental wave oscillation and overtone oscillation with one crystal unit and of optimizing the excitation current depending on the fundamental wave oscillation and the overtone oscillation.

In order to cope with the above-stated problems in the conventional examples, a fundamental wave/overtone crystal oscillator of the present invention includes a crystal unit that can oscillate with fundamental waves or with overtones, and an oscillator circuit that amplifies an excitation current from the crystal unit and outputs an oscillatory frequency. The oscillator circuit includes a transistor having a base and an emitter, the transistor amplifying the excitation current, a first capacitor and a second capacitor are connected in parallel, the first capacitor having one end connected with the base of the transistor to which the excitation current is input and the second capacitor having one end connected with the base, and the other end of the first capacitor and the other end of the second capacitor are connected with the emitter of the transistor, a third capacitor and a first resistor are connected in parallel, the third capacitor having one end connected with the emitter and the first resistor having one end connected with the emitter, and the other end of the third capacitor and the other end of the first resistor are grounded, a first switch is disposed, the first switch turning OFF to disconnect the first capacitor from the oscillator circuit in response to a signal input or turning ON to connect the first capacitor to the oscillator circuit in response to a signal input, and the first switch turns ON when the fundamental wave/overtone crystal oscillator oscillates with fundamental waves, and turns OFF when the fundamental wave/overtone crystal oscillator oscillates with overtones. Thus, the fundamental wave/overtone crystal oscillator of the present invention has the advantages of obtaining fundamental wave oscillation and overtone oscillation with one crystal unit, and of optimizing the excitation current depending on the fundamental wave oscillation and the overtone oscillation.

In the above-stated fundamental wave/overtone crystal oscillator of the present invention, a switch circuit may be disposed between the crystal unit and the oscillator circuit. The switch circuit includes a second resistor and a second switch, and when the fundamental wave/overtone crystal oscillator oscillates with fundamental waves, the second switch is switched so that an excitation current input from the crystal unit is output to the oscillator circuit via the second resistor, and when the fundamental wave/overtone crystal oscillator oscillates with overtones, the second switch is switched so that an excitation current input from the crystal unit is output to the oscillator circuit not via the second resistor.

A fundamental wave/overtone crystal simultaneous oscillator of the present invention includes a crystal unit that can oscillate with fundamental waves or with overtones, a frequency separator that separates an excitation current from the crystal unit, a first oscillator circuit that amplifies an output from the frequency separator and outputs an oscillatory frequency of fundamental waves, and a second oscillator circuit that amplifies an output from the frequency separator and outputs an oscillatory frequency of overtones. The first oscillator circuit includes elements optimized for fundamental wave oscillation, the second oscillator circuit includes elements optimized for overtone oscillation, and the frequency separator includes a first filter and a second filter, the first filter receiving an excitation current from the crystal unit as input, cutting off a signal in an overtone band, letting a signal in a fundamental wave band pass therethrough and outputting the signal to the first oscillator circuit, and the second filter receiving an excitation current from the crystal unit as input, cutting off a signal in a fundamental wave band, letting a signal in an overtone band pass therethrough and outputting the signal to the second oscillator circuit. Thus, the fundamental wave/overtone crystal simultaneous oscillator of the present invention has the advantages of obtaining fundamental wave oscillation and overtone oscillation with one crystal unit, and of optimizing the excitation current depending on the fundamental wave oscillation and the overtone oscillation.

A fundamental wave/overtone crystal oscillator of the present invention includes a crystal unit that can oscillate with fundamental waves or with overtones, a switch circuit that performs switching of an excitation current from the crystal unit for outputting, a first oscillator circuit that amplifies an output from the switch circuit and outputs an oscillatory frequency of fundamental waves, and a second oscillator circuit that amplifies an output from the switch circuit and outputs an oscillatory frequency of overtones. The first oscillator circuit includes elements optimized for fundamental wave oscillation, the second oscillator circuit includes elements optimized for overtone oscillation, and when the fundamental wave/overtone crystal oscillator oscillates with fundamental waves, the switch circuit is switched to output an excitation current input from the crystal unit to the first oscillator circuit, and when the fundamental wave/overtone crystal oscillator oscillates with overtones, the switch circuit is switched to output an excitation current input from the crystal unit to the second oscillator circuit. Thus, the fundamental wave/overtone crystal oscillator of the present invention has the advantages of obtaining fundamental wave oscillation and overtone oscillation with one crystal unit, and of optimizing the excitation current depending on the fundamental wave oscillation and the overtone oscillation.

In a fundamental wave/overtone crystal oscillator of the present invention, a first inverter IC and a second inverter IC are connected in series, an input side and an output side of the first inverter IC is connected via a first resistor, one end of a crystal unit is connected with the input side of the first inverter IC, and the other end of the crystal unit is connected with the output side of the first inverter IC via a second resistor, the one end of the crystal unit is connected with one end of a first capacitor and the other end of the first capacitor is grounded, a switch is connected with the other end of the crystal unit, the switch switching a connection between with a fundamental wave oscillation capacitor and with an overtone oscillation capacitor, the switch is connected with one end of the fundamental wave oscillation capacitor and the other end of the fundamental wave oscillation capacitor is grounded, the switch is connected with one end of the overtone oscillation capacitor, and the other end of the overtone oscillation capacitor is grounded, and when the fundamental wave/overtone crystal oscillator oscillates with fundamental waves, the switch is switched to connect the other end of the crystal unit with the fundamental wave oscillation capacitor, and when the fundamental wave/overtone crystal oscillator oscillates with overtones, the switch is switched to connect the other end of the crystal unit with the overtone oscillation capacitor. Thus, the fundamental wave/overtone crystal oscillator of the present invention has the advantages of obtaining fundamental wave oscillation and overtone oscillation with one crystal unit, and of optimizing the excitation current depending on the fundamental wave oscillation and the overtone oscillation.

In a fundamental wave/overtone crystal oscillator of the present invention, a first inverter IC and a second inverter IC are connected in series, an input side and an output side of the first inverter IC is connected via a first resistor; a first switch is connected with the input side of the first inverter IC, a second switch is connected with the output side of the first inverter IC, one end of a crystal unit is connected with a third switch as well as one end of a first overtone oscillation capacitor, and the other end of the first overtone oscillation capacitor is grounded, the other end of the crystal unit is connected with a fourth switch as well as one end of a second overtone oscillation capacitor, and the other end of the second overtone oscillation capacitor is grounded, the first switch connects the input side of the first inverter IC either with one end of a first fundamental wave oscillation resistor or with one end of a first overtone oscillation resistor, the other end of the first fundamental wave oscillation resistor is connected with one end of a first fundamental wave oscillation capacitor, the other end of the first fundamental wave oscillation capacitor being grounded, the second switch connects the output side of the first inverter IC either with one end of a second fundamental wave oscillation resistor or with one end of a second overtone oscillation resistor, the other end of the second fundamental wave oscillation resistor is connected with one end of a second fundamental wave oscillation capacitor, the other end of the second fundamental wave oscillation capacitor being grounded, the third switch connects the one end of the crystal unit either with a point between the other end of the first fundamental wave oscillation resistor and the one end of the first fundamental wave oscillation capacitor or with the other end of the first overtone oscillation resistor, the fourth switch connects the other end of the crystal unit either with a point between the other end of the second fundamental wave oscillation resistor and the one end of the second fundamental wave oscillation capacitor or with the other end of the second overtone oscillation resistor. When the fundamental wave/overtone crystal oscillator oscillates with fundamental waves, the first switch is switched to connect the input side of the first inverter IC with the one end of the first fundamental wave oscillation resistor, the second switch is switched to connect the output side of the first inverter IC with the one end of the second fundamental wave oscillation resistor, the third switch is switched to connect the one end of the crystal unit with the point between the other end of the first fundamental wave oscillation resistor and the one end of the first fundamental wave oscillation capacitor, and the fourth switch is switched to connect the other end of the crystal unit with the point between the other end of the second fundamental wave oscillation resistor and the one end of the second fundamental wave oscillation capacitor, and when the fundamental wave/overtone crystal oscillator oscillates with overtones, the first switch is switched to connect the input side of the first inverter IC with the one end of the first overtone oscillation resistor, the second switch is switched to connect the output side of the first inverter IC with the one end of the second overtone oscillation resistor, the third switch is switched to connect the one end of the crystal unit with the other end of the first overtone oscillation resistor, and the fourth switch is switched to connect the other end of the crystal unit with the other end of the second overtone oscillation resistor. Thus, the fundamental wave/overtone crystal oscillator of the present invention has the advantages of obtaining fundamental wave oscillation and overtone oscillation with one crystal unit, and of optimizing the excitation current depending on the fundamental wave oscillation and the overtone oscillation.

According to the present invention, a first inverter IC and a second inverter IC are connected in series, an input side and an output side of the first inverter IC is connected via a first resistor, one end of a crystal unit is connected with the input side of the first inverter IC, and the other end of the crystal unit is connected with the output side of the first inverter IC via a second resistor, the one end of the crystal unit is connected with one end of a first capacitor and the other end of the first capacitor is grounded, a switch is connected with the other end of the crystal unit, the switch switching a connection between with a fundamental wave oscillation capacitor and with an overtone oscillation capacitor, the switch is connected with one end of the fundamental wave oscillation capacitor and the other end of the fundamental wave oscillation capacitor is grounded, the switch is connected with one end of the overtone oscillation capacitor, and the other end of the overtone oscillation capacitor is grounded, and when the fundamental wave/overtone crystal oscillator oscillates with fundamental waves, the switch is switched to connect the other end of the crystal unit with the fundamental wave oscillation capacitor, and when the fundamental wave/overtone crystal oscillator oscillates with overtones, the switch is switched to connect the other end of the crystal unit with the overtone oscillation capacitor. Thus, the fundamental wave/overtone crystal oscillator of the present invention has the advantages of obtaining fundamental wave oscillation and overtone oscillation with one crystal unit, and of optimizing the excitation current depending on the fundamental wave oscillation and the overtone oscillation.

According to the present invention, a first inverter IC and a second inverter IC are connected in series, an input side and an output side of the first inverter IC is connected via a first resistor; a first switch is connected with the input side of the first inverter IC, a second switch is connected with the output side of the first inverter IC, one end of a crystal unit is connected with a third switch as well as one end of a first overtone oscillation capacitor, and the other end of the first overtone oscillation capacitor is grounded, the other end of the crystal unit is connected with a fourth switch as well as one end of a second overtone oscillation capacitor, and the other end of the second overtone oscillation capacitor is grounded, the first switch connects the input side of the first inverter IC either with one end of a first fundamental wave oscillation resistor or with one end of a first overtone oscillation resistor, the other end of the first fundamental wave oscillation resistor is connected with one end of a first fundamental wave oscillation capacitor, the other end of the first fundamental wave oscillation capacitor being grounded, the second switch connects the output side of the first inverter IC either with one end of a second fundamental wave oscillation resistor or with one end of a second overtone oscillation resistor, the other end of the second fundamental wave oscillation resistor is connected with one end of a second fundamental wave oscillation capacitor, the other end of the second fundamental wave oscillation capacitor being grounded, the third switch connects the one end of the crystal unit either with a point between the other end of the first fundamental wave oscillation resistor and the one end of the first fundamental wave oscillation capacitor or with the other end of the first overtone oscillation resistor, the fourth switch connects the other end of the crystal unit either with a point between the other end of the second fundamental wave oscillation resistor and the one end of the second fundamental wave oscillation capacitor or with the other end of the second overtone oscillation resistor. When the fundamental wave/overtone crystal oscillator oscillates with fundamental waves, the first switch is switched to connect the input side of the first inverter IC with the one end of the first fundamental wave oscillation resistor, the second switch is switched to connect the output side of the first inverter IC with the one end of the second fundamental wave oscillation resistor, the third switch is switched to connect the one end of the crystal unit with the point between the other end of the first fundamental wave oscillation resistor and the one end of the first fundamental wave oscillation capacitor, and the fourth switch is switched to connect the other end of the crystal unit with the point between the other end of the second fundamental wave oscillation resistor and the one end of the second fundamental wave oscillation capacitor, and when the fundamental wave/overtone crystal oscillator oscillates with overtones, the first switch is switched to connect the input side of the first inverter IC with the one end of the first overtone oscillation resistor, the second switch is switched to connect the output side of the first inverter IC with the one end of the second overtone oscillation resistor, the third switch is switched to connect the one end of the crystal unit with the other end of the first overtone oscillation resistor, and the fourth switch is switched to connect the other end of the crystal unit with the other end of the second overtone oscillation resistor. Thus, the fundamental wave/overtone crystal oscillator of the present invention has the advantages of obtaining fundamental wave oscillation and overtone oscillation with one crystal unit, and of optimizing the excitation current depending on the fundamental wave oscillation and the overtone oscillation.

DESCRIPTION OF REFERENCE NUMERALS 1, 1a, 1b: crystal unit, 2: switch circuit, 3: switch circuit, 4: duplexer (frequency separator), 5: inverter IC, 6: inverter IC, 10: oscillator circuit, 20: oscillator circuit, 30: oscillator circuit

DESCRIPTION OF PREFERRED EMBODIMENTS

The following describes embodiments of the present invention, with reference to the drawings.

Summary of Embodiments

In a fundamental wave/overtone crystal oscillator according to embodiments of the present invention, when the crystal oscillator oscillates with fundamental waves, a circuit configuration for fundamental wave oscillation is selected by a switching operation of a switch, and when the crystal oscillator oscillates with overtones, a circuit configuration for overtone oscillation is selected by a switching operation of a switch. Thus, fundamental wave oscillation and overtone oscillation can be obtained with one crystal unit, and the excitation current can be optimized depending on the fundamental wave oscillation and the overtone oscillation.

Figure 1:
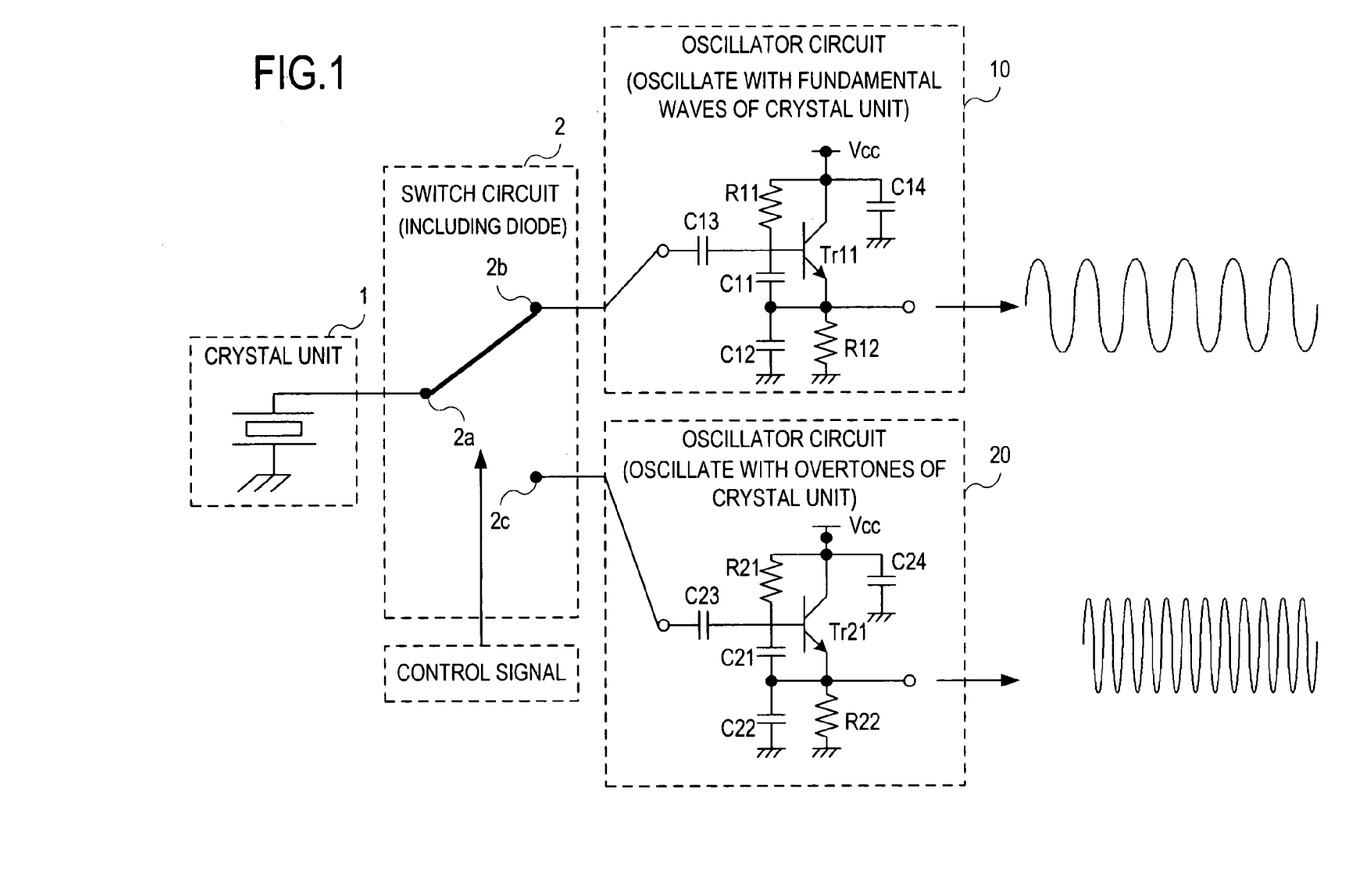
FIG. 1 is a circuit diagram of a circuit-switching type fundamental wave/overtone crystal oscillator according to one embodiment of the present invention.

[First Crystal Oscillator: FIG. 1]

Referring to FIG. 1, a first fundamental wave/overtone crystal oscillator according to one embodiment of the present invention is described below. FIG. 1 is a circuit diagram of a circuit-switching type fundamental wave/overtone crystal oscillator according to one embodiment of the present invention.

As illustrated in FIG. 1, the first fundamental wave/overtone crystal oscillator (first crystal oscillator) according to one embodiment of the present invention is a circuit-switching type fundamental wave/overtone crystal oscillator, basically including a crystal unit 1, a switch circuit 2, a fundamental wave oscillator circuit 10, and an overtone oscillator circuit 20.

[Various Units of First Crystal Oscillator]

The following describes various units of the first crystal oscillator more specifically.

One end of the crystal unit 1 is connected with the switch circuit 2, and the other end of the crystal unit 1 is grounded. A voltage is applied to the crystal unit 1 for oscillation.

The switch circuit 2 performs switching in response to an external control signal so that the one end of the crystal unit is connected with either the oscillator circuit 10 or the oscillator circuit 20. The switch circuit 2 is made up of a diode and the like.

More specifically, the switch circuit 2 includes a terminal 2a on the crystal unit 1 side, a terminal 2b connected with the oscillator circuit 10, and a terminal 2c connected with the oscillator circuit 20. In response to a control signal, the switch circuit 2 performs a switching operation so as to connect the terminal 2a with the terminal 2b in the case of fundamental wave oscillation, and to connect the terminal 2a with the terminal 2c in the case of overtone oscillation.

Values of resistance and capacitance in the oscillator circuit 10 are optimized and set for fundamental wave oscillation.

The oscillator circuit 10 is a Colpitts oscillator circuit, in which an excitation current of the crystal unit 1 is input via the switch circuit 2, the excitation current is fed to the base of a transistor Tr11 via a capacitor C13, and a power supply voltage Vcc is supplied to the collector of the transistor Tr11 as well as the base via a resistor R11. The transistor Tr11 amplifies the excitation current input to the base.

The collector of the transistor Tr11 is connected with one end of a capacitor C14, and the other end of the capacitor C14 is grounded.

The base of the transistor Tr11 is further connected with a capacitor C11 and a capacitor C12 connected in series, and the other end of the capacitor C12 is grounded. The emitter of the transistor Tr11 is grounded via a resistor R12.

A point between the capacitor C11 and the capacitor C12 is connected with the emitter, and an output terminal provided at the emitter outputs an oscillatory frequency for fundamental waves.

Values of resistance and capacitance in the oscillator circuit 20 are optimized and set for overtone oscillation.

The oscillator circuit 20 is a Colpitts oscillator circuit, in which an excitation current of the crystal unit 1 is input via the switch circuit 2, the excitation current is fed to the base of a transistor Tr21 via a capacitor C23, and a power supply voltage Vcc is supplied to the collector of the transistor Tr21 as well as the base via a resistor R21.

The collector of the transistor Tr21 is connected with one end of a capacitor C24, and the other end of the capacitor C24 is grounded.

The base of the transistor Tr21 is further connected with a capacitor C21 and a capacitor C22 connected in series, and the other end of the capacitor C22 is grounded. The emitter of the transistor Tr21 is grounded via a resistor R22.

A point between the capacitor C21 and the capacitor C22 is connected with the emitter, and an output terminal provided at the emitter outputs an oscillatory frequency for overtones.

Note that a switch circuit in the appended claims corresponds to the switch circuit 2, a first oscillator circuit corresponds to the oscillator circuit 10, and a second oscillator circuit corresponds to the oscillator circuit 20.

[Operation of First Crystal Oscillator]

The first crystal oscillator operates as follows. When a control signal for selection between fundamental wave oscillation and overtone oscillation is externally input to the switch circuit 2, the switch circuit 2 operates to connect the terminal 2*a* with the terminal 2*b* or the terminal 2*c*.

When the switch circuit 2 operates to connect the terminal 2*a* with the terminal 2*b*, the oscillator circuit 10 oscillates at a frequency of fundamental waves. When the switch circuit 2 operates to connect the terminal 2*a* with the terminal 2*c*, the oscillator circuit 20 oscillates at a frequency of overtones.

The control signal to control switching at the switch circuit 2 is output from a control circuit, for example.

Figure 2:
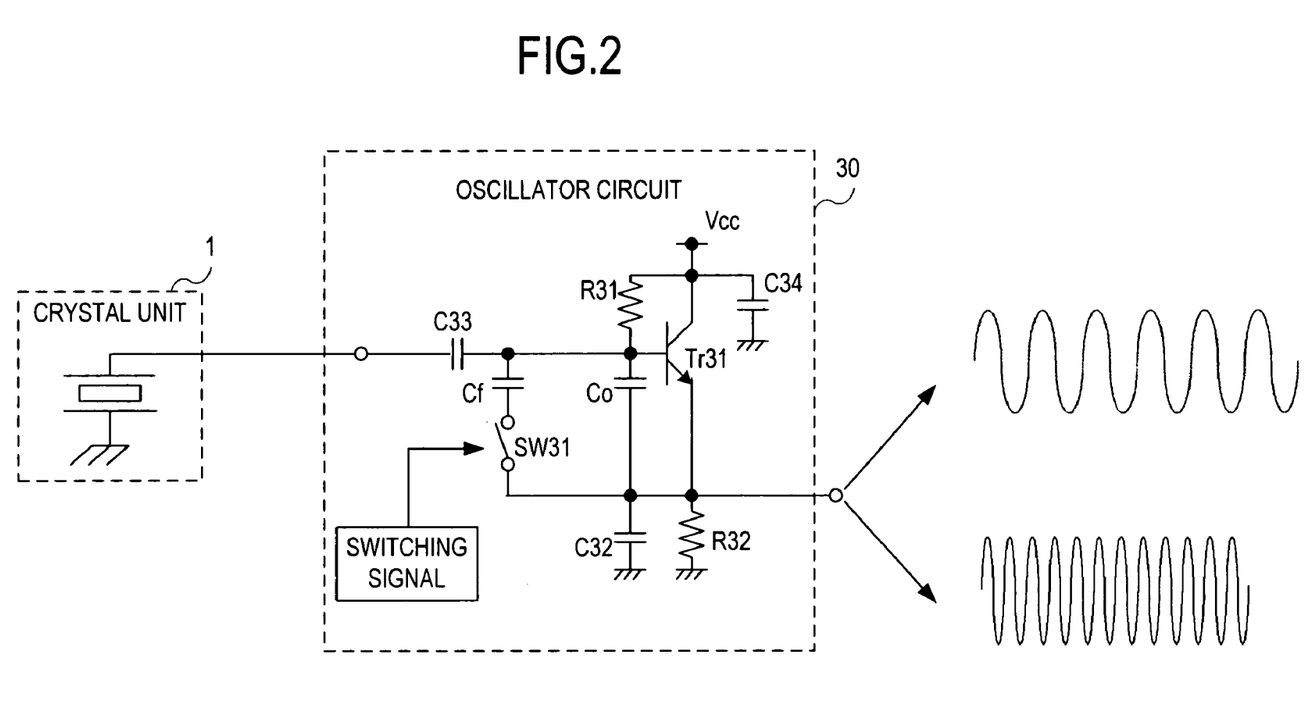
FIG. 2 is a circuit diagram of a capacitor-switching type fundamental wave/overtone crystal oscillator according to one embodiment of the present invention.

[Second Crystal Oscillator: FIG. 2]

Referring to FIG. 2, a second fundamental wave/overtone crystal oscillator according to one embodiment of the present invention is described below. FIG. 2 is a circuit diagram of a capacitor-switching type fundamental wave/overtone crystal oscillator according to one embodiment of the present invention.

As illustrated in FIG. 2, the second fundamental wave/overtone crystal oscillator (second crystal oscillator) according to one embodiment of the present invention is a capacitor-switching type fundamental wave/overtone crystal oscillator, basically including a crystal unit 1 and an oscillator circuit 30.

[Various Units of Second Crystal Oscillator]

The following describes various units of the second crystal oscillator more specifically.

The crystal unit 1 is similar to the crystal unit described referring to FIG. 1.

The oscillator circuit 30 is a Colpitts oscillator circuit, in which an excitation current of the crystal unit 1 is fed to the base of a transistor Tr31 via a capacitor C33, and a power supply voltage Vcc is supplied to the collector of the transistor Tr31 as well as the base via a resistor R31.

The transistor Tr31 amplifies the excitation current input to the base.

The collector of the transistor Tr31 is connected with one end of a capacitor C34, and the other end of the capacitor C34 is grounded.

The base of the transistor Tr31 is further connected with a capacitor Co and a capacitor C32 connected in series, and the other end of the capacitor C32 is grounded.

The emitter of the transistor Tr31 is grounded via a resistor R32.

The base of the transistor Tr31 is connected with one end of a capacitor Cf, and the other end of the capacitor Cf is connected with one end of a switch SW31. The other end of the switch SW31 is connected with a point between the capacitor Co and the capacitor C32. Further, the point between the capacitor Co and the capacitor C32 is connected with the emitter, and an output terminal provided at the emitter outputs an oscillatory frequency for fundamental waves/overtones.

The switch SW31 turns ON/OFF by an external switching signal. In the state of ON, the capacitor C32 is connected with parallel-connection of the capacitor Co and the capacitor Cf, and this connection state has an optimum capacitance of the capacitors for fundamental wave oscillation.

The OFF state of the switch SW31 means a serial-connection state of the capacitor Co and the capacitor C32, and this connection state has an optimum capacitance of the capacitors for overtone oscillation.

Thus, when the switch SW31 is in ON state, fundamental wave oscillation occurs, and when it is in OFF state, overtone oscillation occurs.

Note here that a first capacitor in the appended claims corresponds to the capacitor Cf, a second capacitor corresponds to the capacitor Co, a third capacitor corresponds to the capacitor C32, a first resistor corresponds to the resistor R32 and a first switch corresponds to the switch SW31.

[Operation of Second Crystal Oscillator]

The second crystal oscillator operates as follows.

When a switching signal for selection between fundamental wave oscillation and overtone oscillation is externally input to the switch SW31, and if the switching signal selects fundamental wave oscillation, the switch SW31 turns ON so that the parallel-connection of the capacitor Co and the capacitor Cf is connected with the capacitor C32, thus giving an optimum capacitance of the capacitors for fundamental wave oscillation, and frequencies of fundamental wave oscillation is output from the output terminal.

If the switching signal selects overtone oscillation, the switch SW31 turns OFF so that the capacitor Co and the capacitor C32 are serially connected, thus giving an optimum capacitance of the capacitors for overtone oscillation, and frequencies of overtone oscillation is output from the output terminal.

A switching signal to control ON/OFF of the switch SW31 is output from a control circuit, for example.

Figure 3:
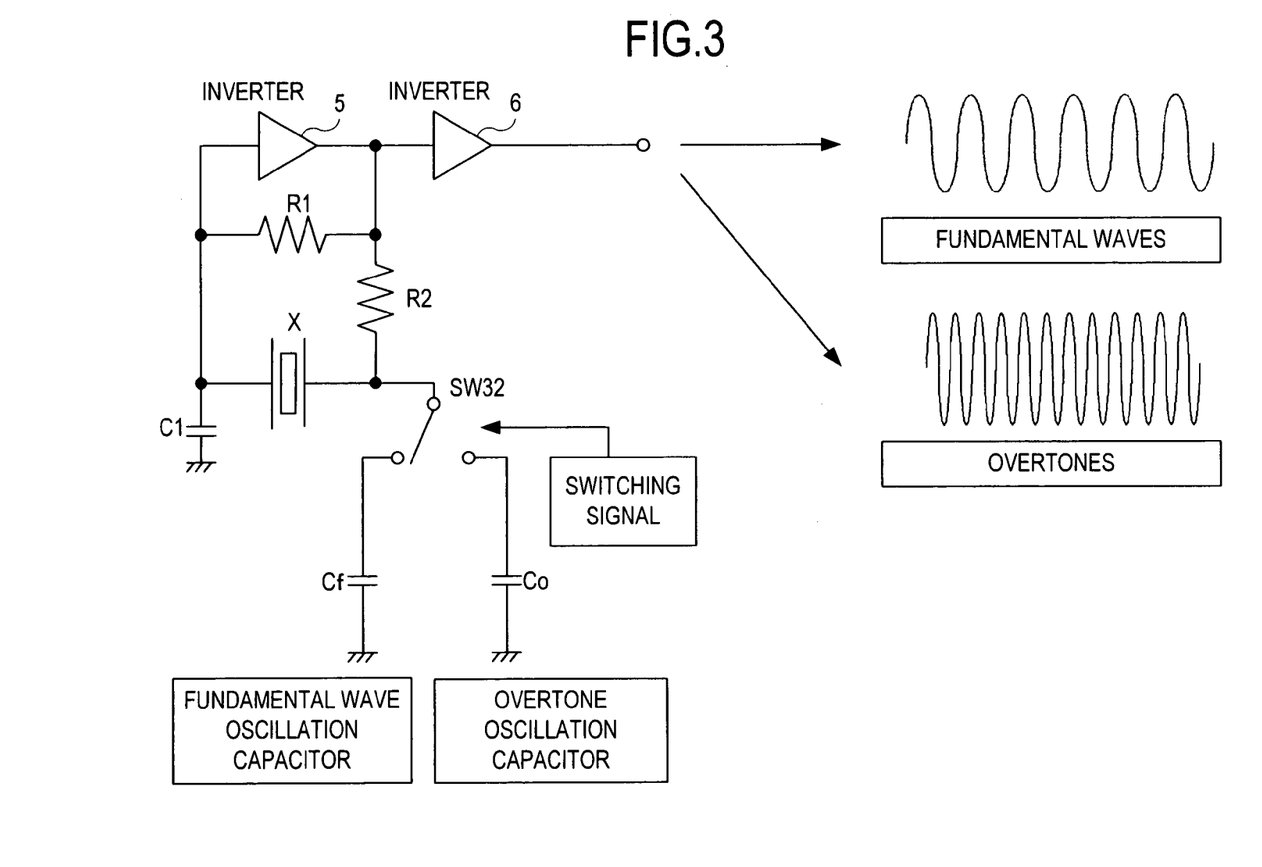
FIG. 3 is a circuit diagram of another capacitor-switching type fundamental wave/overtone crystal oscillator according to one embodiment of the present invention.

[Third Crystal Oscillator: FIG. 3]

Referring to FIG. 3, a third fundamental wave/overtone crystal oscillator according to one embodiment of the present invention is described below. FIG. 3 is a circuit diagram of another capacitor-switching type fundamental wave/overtone crystal oscillator according to one embodiment of the present invention.

As illustrated in FIG. 3, the third fundamental wave/overtone crystal oscillator (third crystal oscillator) according to one embodiment of the present invention is another capacitor-switching type fundamental wave/overtone crystal oscillator including a complementary metal oxide semiconductor (CMOS) inverter.

[Specific Configuration of Third Crystal Oscillator]

The following describes the configuration of the third crystal oscillator more specifically.

As illustrated in FIG. 3, the third crystal oscillator is configured so that one end of a crystal unit X is connected with the input side (gate) of an inverter 105, the one end of the crystal unit X is further connected with one end of a capacitor C1, and the other end of the capacitor C1 is grounded. The output side (drain) of the inverter IC5 is connected with the input side (gate) of an inverter IC6, and a point between the inverter IC5 and the inverter IC6 is connected with the other end of the crystal unit X via a resistor R2.

Then, the output side (drain) of the inverter IC6 is connected with an output terminal of oscillatory frequency.

The gate and the drain of the inverter IC5 is connected via a resistor R1, and a switch SW32 is disposed at the other end of the crystal unit X.

The switch SW32 is configured to connect with either one end of a fundamental wave oscillation capacitor Cf or one end of an overtone oscillation capacitor Co in response to a switching signal. Then, the other ends of the capacitor Cf and the capacitor Co are grounded.

Note here that a first inverter IC in the appended claims corresponds to the inverter IC5, a second inverter IC corresponds to the inverter IC6, a first resistor corresponds to the resistor R1, a second resistor corresponds to the resistor R2, a first capacitor corresponds to the capacitor C1, a switch corresponds to the switch SW32, a fundamental wave oscillation capacitor corresponds to the fundamental wave oscillation capacitor Cf, and an overtone oscillation capacitor corresponds to the overtone oscillation capacitor Co.

[Operation of Third Crystal Oscillator]

The following describes an operation of the third crystal oscillator.

In the case where the third crystal oscillator operates with fundamental wave oscillation, a switching signal is output to the switch SW32 so as to select the fundamental wave oscillation capacitor Cf. Then, the switch SW32 selects the fundamental wave oscillation capacitor Cf, so that a frequency of fundamental wave oscillation is output from the drain of the inverter IC6.

In the case where the third crystal oscillator operates with overtone oscillation, a switching signal is output to the switch SW32 so as to select the overtone oscillation capacitor Co. Then, the switch SW32 selects the overtone oscillation capacitor Co, so that a frequency of overtone oscillation is output from the drain of the inverter IC6.

Figure 4:
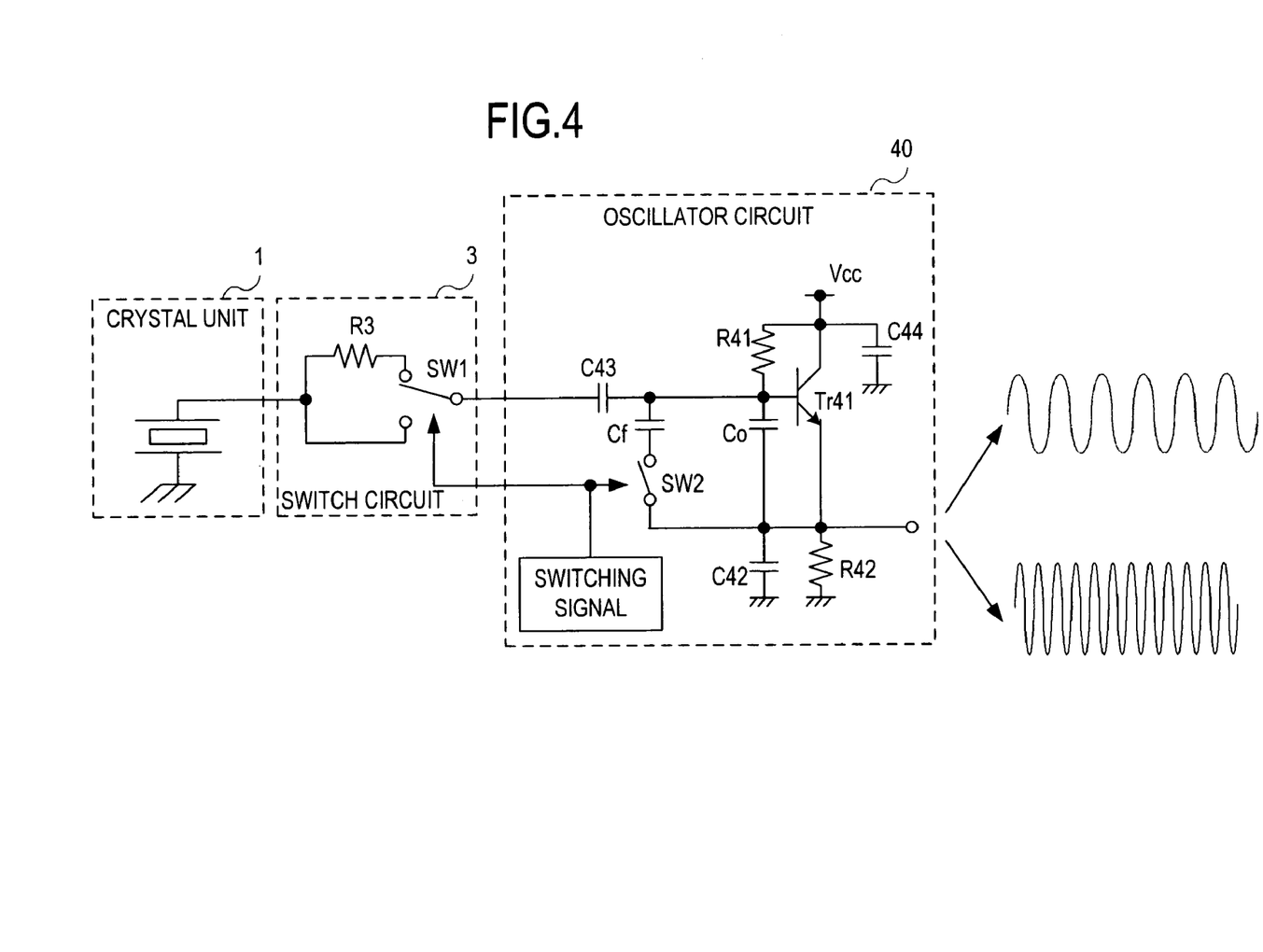
FIG. 4 is a circuit diagram of a resistor/capacitor-switching type fundamental wave/overtone crystal oscillator according to one embodiment of the present invention.

[Fourth Crystal Oscillator: FIG. 4]

Referring to FIG. 4, a fourth fundamental wave/overtone crystal oscillator according to one embodiment of the present invention is described below. FIG. 4 is a circuit diagram of a resistor/capacitor-switching type fundamental wave/overtone crystal oscillator according to one embodiment of the present invention.

As illustrated in FIG. 4, the fourth fundamental wave/overtone crystal oscillator (fourth crystal oscillator) according to one embodiment of the present invention is a resistor/capacitor-switching type fundamental wave/overtone crystal oscillator, basically including a crystal unit 1, a switch circuit 3, and an oscillator circuit 40.

[Various Units of Fourth Crystal Oscillator]

The following describes various units of the fourth crystal oscillator more specifically.

The crystal unit 1 is similar to the crystal unit 1 in the first and the second crystal oscillators.

The switch circuit 3 includes a switch SW1 and a resistor R3, and in response to a switching signal, the switch SW1 allows an excitation current from the crystal unit 1 to be output to the oscillator circuit 40 via the resistor R3 or not via the resistor R3.

The oscillator circuit 40 is a Colpitts oscillator circuit, in which an excitation current of the crystal unit 1 is fed to the base of a transistor Tr41 via a capacitor C43, and a power supply voltage Vcc is supplied to the collector of the transistor Tr41 as well as the base via a resistor R41. The transistor Tr41 amplifies the excitation current input to the base.

The collector of the transistor Tr41 is connected with one end of a capacitor C44, and the other end of the capacitor C44 is grounded.

The base of the transistor Tr41 is further connected with a capacitor Co and a capacitor C42 connected in series, and the other end of the capacitor C42 is grounded.

The emitter of the transistor Tr41 is grounded via a resistor R42.

The base of the transistor Tr41 is connected with one end of a capacitor Cf, and the other end of the capacitor Cf is connected with one end of a switch SW2. The other end of the switch SW2 is connected with a point between the capacitor Co and the capacitor C42. Further, the point between the capacitor Co and the capacitor C42 is connected with the emitter, and an output terminal provided at the emitter outputs an oscillatory frequency for fundamental waves/overtones.

The switch SW2 turns ON/OFF by an external switching signal. In the state of ON, the capacitor C42 is connected with parallel-connection of the capacitor Co and the capacitor Cf, and this connection state has an optimum capacitance of the capacitors for fundamental wave oscillation.

The OFF state of the switch SW41 means a serial-connection state of the capacitor Co and the capacitor C42, and this connection state has an optimum capacitance of the capacitors for overtone oscillation.

Thus, when the switch SW41 is in ON state, fundamental wave oscillation occurs, and when it is in OFF state, overtone oscillation occurs.

Note here that a switch circuit in the appended claims corresponds to the switch circuit 3, a second resistor corresponds to the resistor R3 and a second switch corresponds to the switch SW1.

[Operation of Fourth Crystal Oscillator]

The fourth crystal oscillator operates as follows. When a switching signal for selection between fundamental wave oscillation and overtone oscillation is externally input to the switch SW1 and the switch SW2, and if the switching signal selects fundamental wave oscillation, the switch SW1 connects with the resistor R3 side so that the excitation current is output to the oscillator circuit 40 via the resistor R3, and then the switch SW2 turns ON so that the parallel-connection of the capacitor Co and the capacitor Cf is connected with the capacitor C42, thus giving an optimum capacitance of the capacitors for fundamental wave oscillation, and a frequency of fundamental wave oscillation is output from the output terminal.

If the switching signal selects overtone oscillation, the switch SW1 allows an excitation current from the crystal unit 1 directly to be output to the oscillator circuit 40 so that the switch SW2 turns OFF and the capacitor Co and the capacitor C42 are serially connected, thus giving an optimum capacitance of the capacitors for overtone oscillation, and a frequency of overtone oscillation is output from the output terminal.

A switching signal instructing to control switching of the switch SW1 and to control ON/OFF of the switch SW2 is output from a control circuit, for example.

Figure 5:
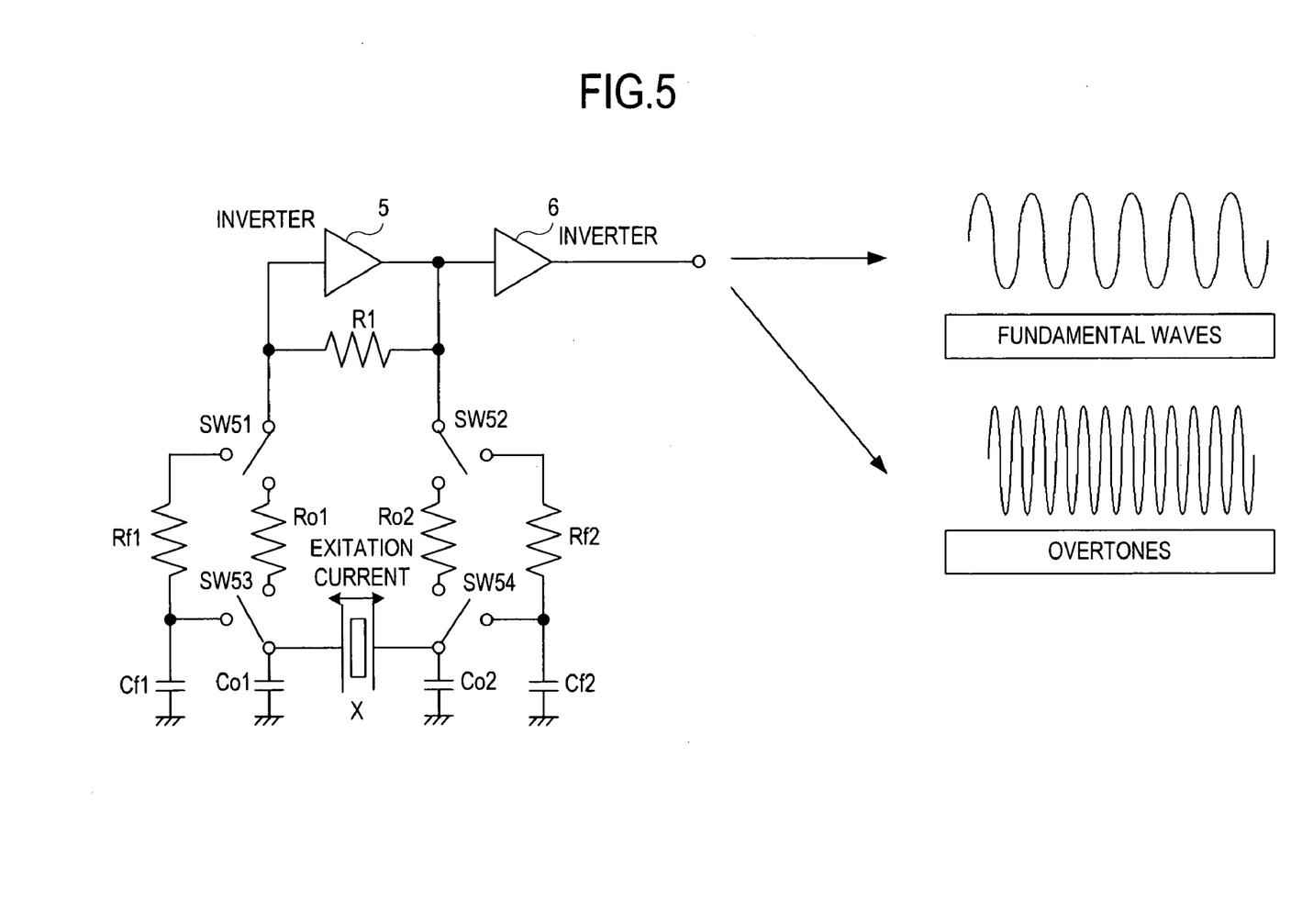
FIG. 5 is a circuit diagram of another resistor/capacitor-switching type fundamental wave/overtone crystal oscillator according to one embodiment of the present invention.

[Fifth Crystal Oscillator: FIG. 5]

Referring to FIG. 5, a fifth fundamental wave/overtone crystal oscillator according to one embodiment of the present invention is described below. FIG. 5 is a circuit diagram of another resistor/capacitor-switching type fundamental wave/overtone crystal oscillator according to one embodiment of the present invention.

As illustrated in FIG. 5, the fifth fundamental wave/overtone crystal oscillator (fifth crystal oscillator) according to one embodiment of the present invention is another resistor/capacitor-switching type fundamental wave/overtone crystal oscillator including a CMOS inverter.

[Specific Configuration of Fifth Crystal Oscillator]

The following describes the configuration of the fifth crystal oscillator more specifically.

As illustrated in FIG. 5, the fifth crystal oscillator is configured so that one end of a crystal unit X is connected with one end of an overtone oscillation capacitor Co1 as well as a switch SW53, and the other end of the crystal unit X is connected with one end of an overtone oscillation capacitor Co2 as well as a switch SW54. The other ends of the overtone oscillation capacitors Co1 and Co2 are grounded.

The input side (gate) of an inverter IC5 is connected with a switch SW51, the output side (drain) of the inverter IC5 is connected with the input side (gate) of an inverter IC6, and a point between the inverter IC5 and the inverter IC6 is connected with a switch SW52.

Then, the output side (drain) of the inverter IC6 is connected with an output terminal of oscillatory frequency.

The gate and the drain of the inverter IC5 is connected via a resistor R1.

The switch SW51 is configured to connect with either one end of a fundamental wave oscillation resistor Rf1 or one end of an overtone oscillation resistor Ro1 in response to a switching signal. Then, the other end of the fundamental wave oscillation resistor Rf1 is connected with one end of the fundamental wave oscillation capacitor Cf1 and the other end of the fundamental wave oscillation capacitor Cf1 is grounded. The other end of the overtone oscillation resistor Ro1 is connected with the switch SW53.

The switch SW52 is configured to connect with either one end of a fundamental wave oscillation resistor Rf2 or one, end of an overtone oscillation resistor Ro2 in response to a switching signal. Then, the other end of the fundamental wave oscillation resistor Rf2 is connected with one end of the fundamental wave oscillation capacitor Cf2 and the other end of the fundamental wave oscillation capacitor Cf2 is grounded. The other end of the overtone oscillation resistor Ro2 is connected with the switch SW54.

The switch SW53 is configured to connect with either a point between the other end of the fundamental wave oscillation resistor Rf1 and the one end of the fundamental wave oscillation capacitor Cf1 or the other end of the overtone oscillation resistor Ro1 in response to a switching signal.

The switch SW54 is configured to connect with either a point between the other end of the fundamental wave oscillation resistor Rf2 and the one end of the fundamental wave oscillation capacitor Cf2 or the other end of the overtone oscillation resistor Ro2 in response to a switching signal.

Herein, when the switch SW51 is connected with the one end of the fundamental wave oscillation resistor Rf1 and the switch SW52 is connected with the one end of the fundamental wave oscillation resistor Rf2, the switch SW53 is connected with the point between the other end of the fundamental wave oscillation resistor Rf1 and the one end of the fundamental wave oscillation capacitor Cf1, and the switch SW54 is connected with the point between the other end of the fundamental wave oscillation resistor Rf2 and the one end of the fundamental wave oscillation capacitor Cf2.

That is, in the case of fundamental wave oscillation, the overtone oscillation resistors Ro1 and Ro2 are removed from the configuration.

When the switch SW51 is connected with the one end of the overtone oscillation resistor Ro1 and the switch SW52 is connected with the one end of the overtone oscillation resistor Ro2, the switch SW53 is connected with the other end of the overtone oscillation resistor Ro1 and the switch SW54 is connected with the other end of the overtone oscillation resistor Ro2.

That is, in the case of overtone oscillation, the fundamental wave oscillation resistors Rf1 and Rf2 and the fundamental wave oscillation capacitors Cf1 and Cf2 are removed from the configuration.

Note that a first inverter IC in the appended claims corresponds to the inverter IC5, a second inverter IC corresponds to the inverter IC6, a first resistor corresponds to the resistor R1, a first fundamental wave oscillation resistor corresponds to the fundamental wave oscillation resistor Rf1, a second fundamental wave oscillation resistor corresponds to the fundamental wave oscillation resistor Rf2, a first overtone oscillation resistor corresponds to the overtone oscillation resistor Ro1, a second overtone oscillation resistor corresponds to the overtone oscillation resistor Ro2, a first fundamental wave oscillation capacitor corresponds to the fundamental wave oscillation capacitor Cf1, a second fundamental wave oscillation capacitor corresponds to the fundamental wave oscillation capacitor Cf2, a first overtone oscillation capacitor corresponds to the overtone oscillation capacitor Co1, a second overtone oscillation capacitor corresponds to the overtone oscillation capacitor Co2, a first switch corresponds to the switch SW51, a second switch corresponds to the switch SW52, a third switch corresponds to the switch SW53, and a fourth switch corresponds to the switch SW54.

[Operation of Fifth Crystal Oscillator]

The following describes an operation of the fifth crystal oscillator.

In the case where the fifth crystal oscillator operates with fundamental wave oscillation, a switching signal is output to the switches SW51 and SW52 so as to select the fundamental wave oscillation capacitors Cf1 and Cf2. Then, the switch SW51 selects the fundamental wave oscillation capacitor Cf1 and the switch SW52 selects the fundamental wave oscillation capacitor Cf2, so that the serial-connected circuit of the fundamental wave oscillation resistor Rf1 and the fundamental wave oscillation capacitor Cf1 is connected with the gate side of the inverter IC5 and the serial-connected circuit of the fundamental wave oscillation resistor Rf2 and the fundamental wave oscillation capacitor Cf2 is connected with a point between the drain of the inverter IC5 and the gate of the inverter IC6.

Further, the switch SW53 connects the point between the fundamental wave oscillation resistor Rf1 and the fundamental wave oscillation capacitor Cf1 with the overtone oscillation capacitor Co1 as well as with the one end of the crystal unit X. The switch SW54 connects the point between the fundamental wave oscillation resistor Rf2 and the fundamental wave oscillation capacitor Cf2 with the overtone oscillation capacitor Co2 as well as with the other end of the crystal unit X.

With the above-stated operation of the switches SW51 to SW54, a frequency of fundamental wave oscillation is output from the drain of the inverter IC6.

In the case where the fifth crystal oscillator operates with overtone oscillation, a switching signal is output to the switches SW51 and SW52 so as to select the overtone oscillation resistors Ro1 and Ro2, and the switch SW51 selects the overtone oscillation resistor Ro1 and the switch SW52 selects the overtone oscillation resistor Ro2.

Further, a switching signal is output to the switches SW53 and SW54 so as to select the overtone oscillation resistors Ro1 and Ro2, and the switch SW53 selects the overtone oscillation resistor Ro1 and the switch SW54 selects the overtone oscillation resistor Ro2.

Thereby, the gate of the inverter IC5 is serially connected with the overtone oscillation resistor Ro1 and the overtone oscillation capacitor Co1, and a point between the overtone oscillation resistor Ro1 and the overtone oscillation capacitor Co1 is connected with the one end of the crystal unit X.

Further, the point between the drain of the inverter IC5 and the gate of the inverter IC6 is serially connected with the overtone oscillation resistor Ro2 and the overtone oscillation capacitor Co2, and a point between the overtone oscillation resistor Ro2 and the overtone oscillation capacitor Co2 is connected with the other end of the crystal unit X.

With the above-stated operation of the switches SW51 to SW54, a frequency of overtone oscillation is output from the drain of the inverter IC6.

Figure 6:
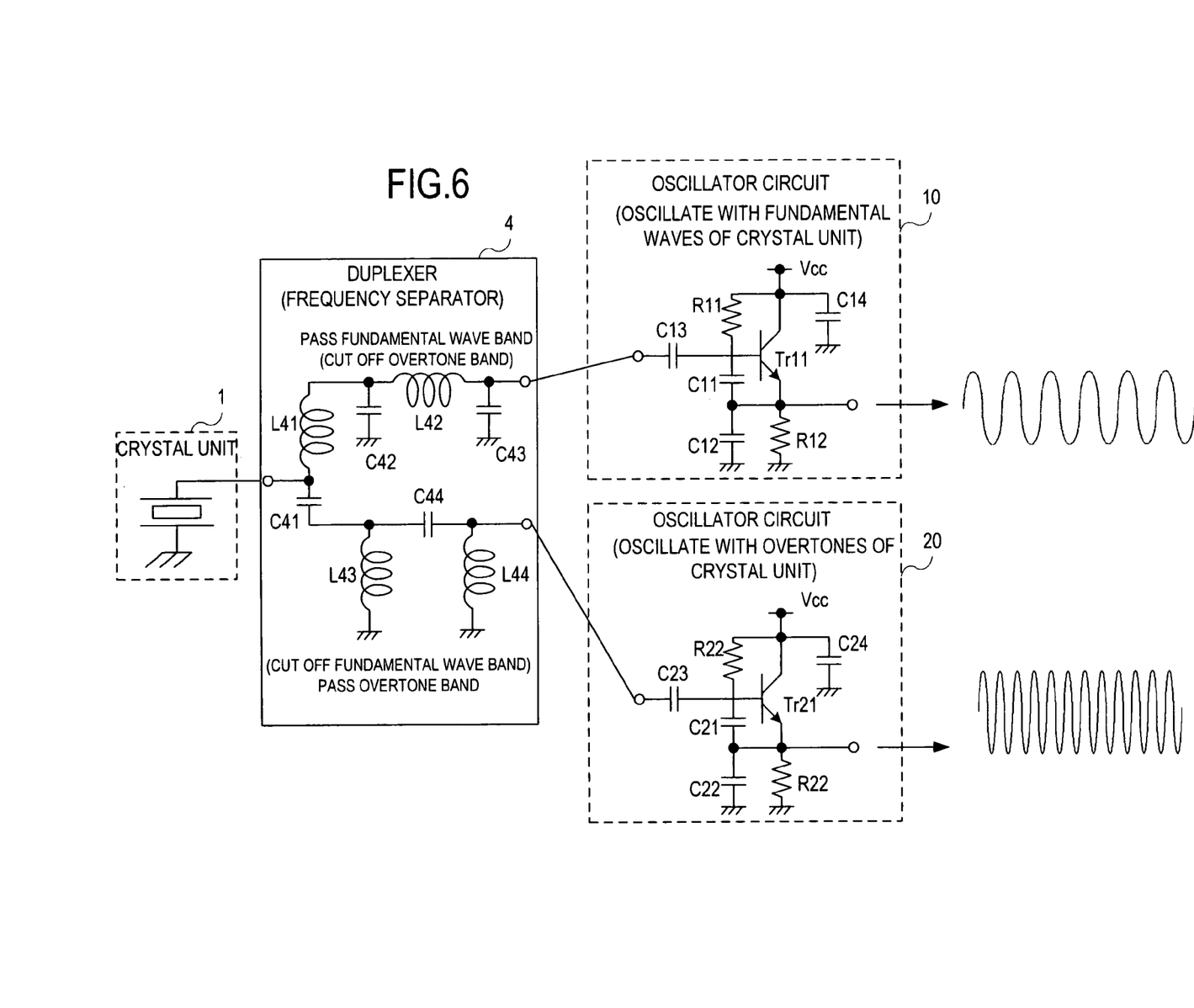
FIG. 6 is a circuit diagram of a fundamental wave/overtone crystal simultaneous oscillator according to one embodiment of the present invention.

[Sixth Crystal Oscillator: FIG. 6]

Referring to FIG. 6, a sixth fundamental wave/overtone crystal oscillator according to one embodiment of the present invention is described below. FIG. 6 is a circuit diagram of a fundamental wave/overtone crystal simultaneous oscillator according to one embodiment of the present invention.

As illustrated in FIG. 6, the sixth fundamental wave/overtone crystal simultaneous oscillator according to one embodiment of the present invention is a fundamental wave/overtone crystal simultaneous oscillator, basically including a crystal unit 1, a duplexer (frequency separator) 4, an oscillator circuit 10, and an oscillator circuit 20.

[Various units of Sixth Crystal Oscillator]

The following describes various units of the sixth crystal oscillator more specifically.

The crystal unit 1, the oscillator circuit 10 and the oscillator circuit 20 are similar to the configuration in the first crystal oscillator of FIG. 1.

The duplexer (frequency separator) 4 receives an excitation current from the crystal unit 1 as input and branches the same, and then lets one of the branched excitation current pass through a fundamental wave band (cut off an overtone band) and outputs the same to the oscillator circuit 10, whereas lets the other branched excitation current pass through an overtone band (cut off an fundamental wave band) and outputs the same to the oscillator circuit 20.

[Specific Configuration of Duplexer (Frequency Separator) 4]

More specifically, the duplexer 4 includes the combination of a low pass filter (LPF) and a high pass filter (HPF).

FIG. 6 illustrates just one example, and other filter configurations are also possible as long as they include LPFs and HPFs.

A LPF part in the duplexer 4 includes a coil L41 and a coil L42 serially connected, a point between the coil L41 and the coil L42 being connected with one end of a capacitor C42, and the other end of the capacitor C42 being grounded. At a latter stage of the coil L42, one end of a capacitor C43 is connected, and the other end of the capacitor C43 is grounded.

Then, the latter stage of the coil L42 is connected with the input of the oscillator circuit 10.

A HPF part in the duplexer 4 includes a capacitor C41 and a capacitor C44 serially connected, a point between the capacitor C1 and the capacitor C44 being connected with one end of a coil L43, and the other end of the coil L43 being grounded. At a latter stage of the capacitor C44, one end of a coil L44 is connected, and the other end of the coil L44 is grounded.

Then, the latter stage of the capacitor C44 is connected with the input of the oscillator circuit 20.

Herein, one end of the crystal unit 1 is connected with a point between the coil L41 and the capacitor C41.

Note here that a frequency separator in the appended, claims corresponds to the duplexer 4, a first oscillator circuit corresponds to the oscillator circuit 10, a second oscillator circuit corresponds to the oscillator circuit 20, a first filter corresponds to the LPF and a second filter corresponds to the HPF.

[Operation of Sixth Crystal Oscillator]

The sixth crystal oscillator operates as follows. When an excitation current of the crystal unit 1 is input to the duplexer 4, the LPF part cuts off an overtone band and lets a current in a fundamental wave band pass therethrough, and outputs the current to the oscillator circuit 10. The HPF part cuts off a fundamental wave band and lets a current in an overtone band pass therethrough, and outputs the current to the oscillator circuit 20.

The oscillator circuit 10 oscillates with fundamental waves and outputs a frequency of fundamental wave oscillation.

The oscillator circuit 20 oscillates with overtones and outputs a frequency of overtone oscillation.

Advantages of Embodiments

According to the first to the sixth crystal oscillators, while the elements in an oscillator circuit can be optimized for fundamental waves, the elements in an oscillator circuit can be optimized for overtones. Therefore, the crystal oscillators have the advantages of obtaining fundamental wave oscillation and overtone oscillation with one crystal unit, and of optimizing the excitation current depending on the fundamental wave oscillation and the overtone oscillation.

Further, according to the first to the fifth crystal oscillators, optimized fundamental wave oscillation or overtone oscillation can be obtained, and according to the sixth crystal oscillator, optimized fundamental wave oscillation and overtone oscillation can be obtained simultaneously.

The present invention is suitable for a fundamental wave/overtone crystal oscillator capable of obtaining fundamental wave oscillation and overtone oscillation with one crystal unit and of optimizing the excitation current depending on the fundamental wave oscillation and the overtone oscillation.

What is claimed is:

1. A fundamental wave/overtone crystal oscillator including a crystal unit that can oscillate with fundamental waves or with overtones, and an oscillator circuit that amplifies an excitation current from the crystal unit and outputs an oscillatory frequency, wherein the oscillator circuit comprises a transistor having a base and an emitter, the transistor amplifying the excitation current, a first capacitor and a second capacitor are connected in parallel the first capacitor having one end connected with the base of the transistor to which the excitation current is input and the second capacitor having one end connected with the base, and the other end of the first capacitor and the other end of the second capacitor are connected with the emitter of the transistor, a third capacitor and a first resistor are connected in parallel, the third capacitor having one end connected with the emitter and the first resistor having one end connected with the emitter, and the other end of the third capacitor and the other end of the first resistor are grounded, a first switch is disposed, the first switch turning OFF to disconnect the first capacitor from the oscillator circuit in response to a signal input or turning ON to connect the first capacitor to the oscillator circuit in response to a signal input, the first switch turns ON when the fundamental wave/overtone crystal oscillator oscillates with fundamental waves, and turns OFF when the fundamental wave/overtone crystal oscillator oscillates with overtones, a switch circuit is disposed between the crystal unit and the oscillator circuit, wherein the switch circuit includes a second resistor and a second switch, and when the fundamental wave/overtone crystal oscillator oscillates with fundamental waves, the second switch is switched so that an excitation current input from the crystal unit is output to the oscillator circuit via the second resistor, and when the fundamental wave/overtone crystal oscillator oscillates with overtones, the second switch is switched so that an excitation current input from the crystal unit is output to the oscillator circuit not via the second resistor.

2. A fundamental wave/overtone crystal simultaneous oscillator including a crystal unit that can oscillate with fundamental waves or with overtones, a frequency separator that separates an excitation current from the crystal unit, a first oscillator circuit that amplifies an output from the frequency separator and outputs an oscillatory frequency of fundamental waves, and a second oscillator circuit that amplifies an output from the frequency separator and outputs an oscillatory frequency of overtones, wherein the first oscillator circuit includes elements optimized for fundamental wave oscillation, the second oscillator circuit includes elements optimized for overtone oscillation, and the frequency separator includes a first filter and a second filter, the first filter receiving an excitation current from the crystal unit as input, cutting off a signal in an overtone band, letting a signal in a fundamental wave band pass therethrough and outputting the signal to the first oscillator circuit, and the second filter receiving an excitation current from the crystal unit as input, cutting off a signal in a fundamental wave band, letting a signal in an overtone band pass therethrough and outputting the signal to the second oscillator circuit.

3. A fundamental wave/overtone crystal oscillator wherein a first inverter IC and a second inverter IC are connected in series, an input side and an output side of the first inverter IC is connected via a first resistor;

a first switch is connected with the input side of the first inverter IC, a second switch is connected with the output side of the first inverter IC, one end of a crystal unit is connected with a third switch as well as one end of a first overtone oscillation capacitor, and the other end of the first overtone oscillation capacitor is grounded, the other end of the crystal unit is connected with a fourth switch as well as one end of a second overtone oscillation capacitor, and the other end of the second overtone oscillation capacitor is grounded, the first switch connects the input side of the first inverter IC either with one end of a first fundamental wave oscillation resistor or with one end of a first overtone oscillation resistor, the other end of the first fundamental wave oscillation resistor is connected with one end of a first fundamental wave oscillation capacitor, the other end of the first fundamental wave oscillation capacitor being grounded, the second switch connects the output side of the first inverter IC either with one end of a second fundamental wave oscillation resistor or with one end of a second overtone oscillation resistor, the other end of the second fundamental wave oscillation resistor is connected with one end of a second fundamental wave oscillation capacitor, the other end of the second fundamental wave oscillation capacitor being grounded, the third switch connects the one end of the crystal unit either with a point between the other end of the first fundamental wave oscillation resistor and the one end of the first fundamental wave oscillation capacitor or with the other end of the first overtone oscillation resistor, the fourth switch connects the other end of the crystal unit either with a point between the other end of the second fundamental wave oscillation resistor and the one end of the second fundamental wave oscillation capacitor or with the other end of the second overtone oscillation resistor, when the fundamental wave/overtone crystal oscillator oscillates with fundamental waves, the first switch is switched to connect the input side of the first inverter IC with the one end of the first fundamental wave oscillation resistor, the second switch is switched to connect the output side of the first inverter IC with the one end of the second fundamental wave oscillation resistor, the third switch is switched to connect the one end of the crystal unit with the point between the other end of the first fundamental wave oscillation resistor and the one end of the first fundamental wave oscillation capacitor, and the fourth switch is switched to connect the other end of the crystal unit with the point between the other end of the second fundamental wave oscillation resistor and the one end of the second fundamental wave oscillation capacitor, and when the fundamental wave/overtone crystal oscillator oscillates with overtones, the first switch is switched to connect the input side of the first inverter IC with the one end of the first overtone oscillation resistor, the second switch is switched to connect the output side of the first inverter IC with the one end of the second overtone oscillation resistor, the third switch is switched to connect the one end of the crystal unit with the other end of the first overtone oscillation resistor, and the fourth switch is switched to connect the other end of the crystal unit with the other end of the second overtone oscillation resistor.

* * * * *